United States Patent [19]

Pham et al.

[11] 4,402,127

[45] Sep. 6, 1983

[54] METHOD OF MANUFACTURING A LOGIC CIRCUIT INCLUDING AT LEAST ONE FIELD-EFFECT TRANSISTOR STRUCTURE OF THE NORMALLY-OFF TYPE AND AT LEAST ONE SATURABLE RESISTOR

[75] Inventors: Ngu T. Pham; Gerard Nuzillat, both of Paris, France

[73] Assignee: Thomason-CSF, Paris, France

[21] Appl. No.: 295,108

[22] Filed: Aug. 21, 1981

Related U.S. Application Data

[63] Continuation-in-part of Ser. No. 121,179, Feb. 13, 1980, abandoned.

[30] Foreign Application Priority Data

Feb. 13, 1979 [FR] France .............................. 79 03639

[51] Int. Cl.³ ........................................ H01L 21/302
[52] U.S. Cl. .................................. 29/571; 29/574; 29/577 C; 29/580; 29/583; 29/589; 357/3; 357/15; 357/55
[58] Field of Search .............. 29/571, 574, 580, 583, 29/589, 590, 577 R, 577 C; 357/3, 15, 22, 41, 357/55; 307/304, 317 A, 450

[56] References Cited

U.S. PATENT DOCUMENTS

| 3,767,984 | 10/1973 | Shinoda et al. | 357/15 X |
|---|---|---|---|
| 3,813,585 | 5/1974 | Tarui et al. | 357/3 X |
| 3,959,807 | 5/1976 | Upadhyayula et al. | 357/3 |
| 4,028,556 | 6/1977 | Cachier et al. | 307/304 X |
| 4,069,493 | 1/1978 | Bobenrieth | 307/450 X |
| 4,300,064 | 11/1981 | Eden | 307/450 X |
| 4,321,613 | 3/1982 | Hughes et al. | 29/580 X |

Primary Examiner—M. J. Andrews
Assistant Examiner—Alan E. Schiavelli
Attorney, Agent, or Firm—Oblon, Fisher, Spivak, McClelland & Maier

[57] ABSTRACT

A method of manufacturing a logic circuit having at least one field effect transistor connected in series with at least one saturable resistor, wherein an active semiconductor layer is formed with a predetermined thickness on a semi-insulating substrate, ohmic contacts are deposited to produce source and drain regions for the resistor and the transistor, a Schottky contact is deposited between the resistor source and drain ohmic contacts to form a gate region which is then electrically connected to the resistor source contact by means of a metal connection, whereupon the localized thickness of the active layer is measured by measuring the drain-source current to the resistor upon application of a predetermined voltage thereto and a groove then cut between the source and drain contacts of the field effect transistor to obtain a predetermined channel depth from the bottom of the groove to the semi-insulating substrate. Then, a Schottky contact is deposited in the groove of the field effect transistor and the logic circuit completed conventionally.

6 Claims, 18 Drawing Figures

METHOD OF MANUFACTURING A LOGIC CIRCUIT INCLUDING AT LEAST ONE FIELD-EFFECT TRANSISTOR STRUCTURE OF THE NORMALLY-OFF TYPE AND AT LEAST ONE SATURABLE RESISTOR

CROSS REFERENCE TO RELATED APPLICATION

This application is a continuation in part of U.S. patent application Ser. No. 121,179 filed Feb. 13, 1980 now abandoned.

BACKGROUND OF THE INVENTION

1. Field of the Invention

This invention relates to a method of manufacturing a field-effect transistor of the "normally off" type (as defined below), which can be employed as a saturable resistor when provision is not made for a control gate, as well as the manufacture of logic circuits which make use of at least one resistor and/or a transistor having said structure.

2. Description of the Prior Art

At the present time, all integrated circuits on GaAs (gallium arsenide) are fabricated from transistors either of the junction field-effect type (JFET) or of the Schottky gate type (MESFET).

Transistors are of two types: normally conducting transistors, in which the drain-source current is cut-off by pinching the normally existing channel (depletion transistors) by applying a suitable voltage; and the normally closed transistors, in which the channel is opened by applying a suitable gate voltage (enhancement transistors).

The depletion mode-type transistor suffers from the disadvantage of high power consumption. Moreover, the input voltage $V_{GS}$ (gate-source potential difference) and the output voltage $V_{DS}$ (drain-source potential difference) are of opposite polarity. In the case of an n-type channel, the cut-off voltage is negative whereas the supply voltage is positive. Consequently, provision has to be made for two supply sources.

In enhancement mode-type transistors, it is necessary to control the value of the threshold voltage or minimum turn-on voltage, and therefore of doping and of thickness of the active zone (in which the channel is formed). Fabrication is a very delicate process and results in a high proportion of production rejects.

The invention makes it possible to overcome the above-mentioned disadvantages by means of a structure wherein the channel comprises a notch or groove.

SUMMARY OF THE INVENTION

The structure according to the invention comprises a layer of semiconductor material on semi-insulating substrate, the character and type of doping of said material being such as to set up a dipolar domain in respect of a given electric field, two ohmic contacts being formed on said layer.

The structure is primarily distinguished by the fact that a groove is cut in the semiconductor layer so as to delimit a residual channel in the material, the dimensions of said channel being such that the critical value of the electric field is overstepped in respect of a value of the order of one volt of the voltage between the ohmic contacts.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
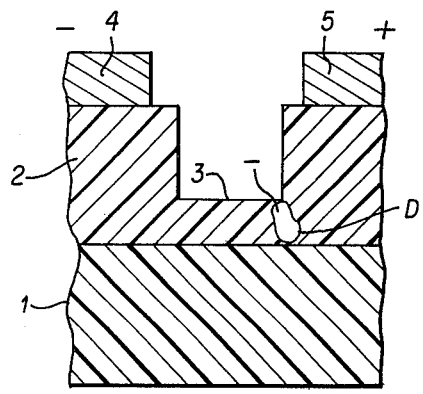
FIGS. 1 and 2 are sectional views showing two examples of resistors having a structure according to the invention.
Figure 2:
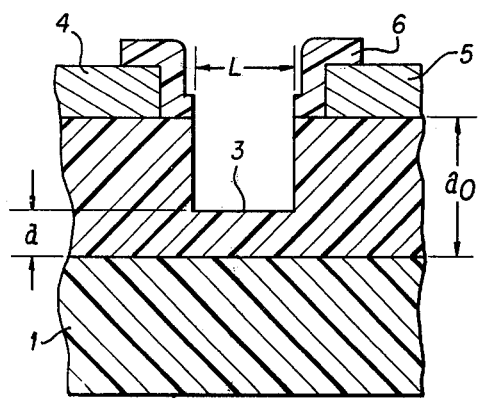

Referring now to the drawings, wherein like reference numerals designate identical or corresponding parts throughout the several views, and more particularly to FIGS. 1 and 2 thereof, the reference numeral 1 designates a semi-insulating logical substrate of gallium arsenide (GaAs), the reference numeral 2 designates an epitaxial layer of the same material and doped by an impurity of n-type conductivity, and the reference numerals 4, 5 designate two ohmic contacts on said layer.

Between the contacts 4 and 5, a groove 3 having a bottom wall thickness a has been cut in the active layer having a thickness $a_o$. In FIG. 2, the complete assembly is partially covered by a layer 6 of silica which protects the edge of the ohmic contacts.

It has been discovered in the laboratories of the present Applicant that, under certain conditions which will be explained in detail hereinafter, the current between ohmic contacts rapidly attains a saturation value $I_S$ which is practically a constant in the case of a given material such as gallium arsenide, for example, and a given geometrical configuration having the following dimensions, for example:

a = depth of residual channel (of the order of $0.1\mu$)
L = length of channel (of the order of one micron)
Z = width of channel (of the order of 10 to $100\mu$)

The following empirical formula has been established:

$$I_S = \gamma(V_c)^2 Z \qquad (1)$$

in which $\gamma$ is a characteristic coefficient of the material (40 microamperes per volt and per micron having a length Z in the case of gallium arsenide) and in which $V_c$ is defined as follows:

$V_c$ is the knee voltage of the saturation curve or in other words the voltage between ohmic contacts at which the current attains a value very close to the value at saturation.

As is the case with $I_S$, it is observed that $V_c$ is remarkably constant in respect of a given material and a given configuration in a collective fabrication of devices having the structure according to the invention.

The following breakdown of the voltage $V_c$ has been proposed:

$$V_c = V_X - V_T \qquad (2)$$

wherein $V_X$ is the voltage between the edges of the groove when the field E attains the critical value $E_c$ in the case of said material. We have:

$$V_X = E_c L \qquad (3)$$

Furthermore, $V_T$ is the threshold voltage or pinch-off voltage. In fact, in a field-effect transistor (even in a gateless structure as in the case of the structure according to the invention), a certain space charge exists in the groove, which explains the reason for transistors of the "normally off" type. It is this space charge which explains the introduction of the term $V_T$.

In the case of the orders of magnitude defined earlier in regard to the material and the configuration, said threshold voltage is as follows:

$$-0.5 \leq V_T \leq +0.2 \text{ volt}$$

Example of Calculation in the Case of $I_S$ when:
$a = 0.1\mu$
$L = 1\mu$
$Z = 20\mu$
we have in the case of n-doped gallium arsenide at $10^{17}$ at/cm³:
$V_X = 3300 \text{ V/cm} \times 10^{-4} \text{ cm} = 0.33 \text{ volt}$
$V_T = -0.2 \text{ volt}$
$V_c = 0.53 \text{ volt}$
$I_S = 40 \, (0.53)^2 \cdot 20 = 224$ microamperes.

A noteworthy feature is the low value of this saturation current which is particularly advantageous when very low power consumption is a desirable objective. Fabrication of this structure is wholly possible by making use of the ionic machining process.

Figure 3:
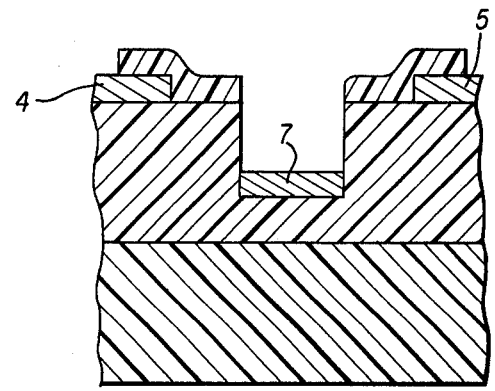
FIGS. 3 and 4 are sectional views showing two examples of construction of field-effect transistors which make use of a structure according to the invention.
Figure 4:
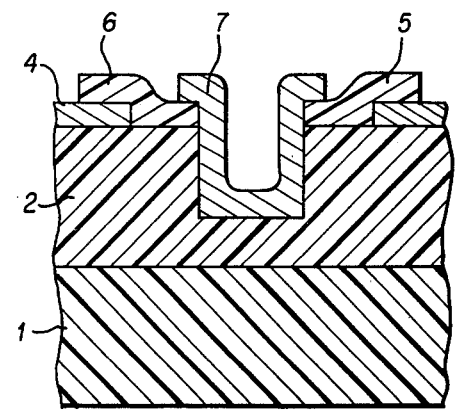

The sectional views of FIGS. 3 and 4 show respectively a field-effect transistor and a Schottky gate transistor which utilizes the structure according to the invention. The same references designate the same elements as in the previous figures. The terminals 4 and 5 are respectively the source and the drain of said transistors. A metallic deposit 7 constitutes the transistor gate.

Figure 5:
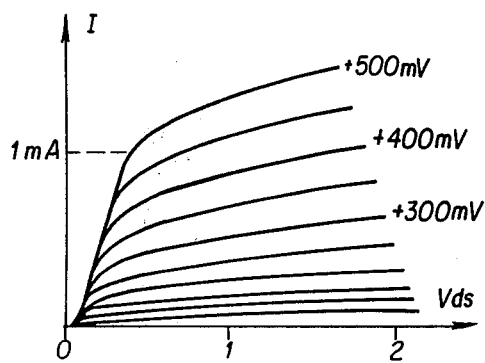
FIGS. 5 and 6 are explanatory diagrams.
Figure 6:
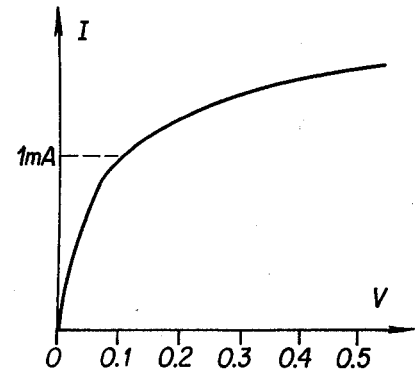

FIGS. 5 and 6 are examples of characteristic curves representing the current I and the voltage V in the case of the elements shown in FIGS. 1 and 2 and the families of characteristic curves $I = f(V_{ds})$ represent different voltages applied to the gate in the case of the elements of FIGS. 3 and 4.

Figure 7:
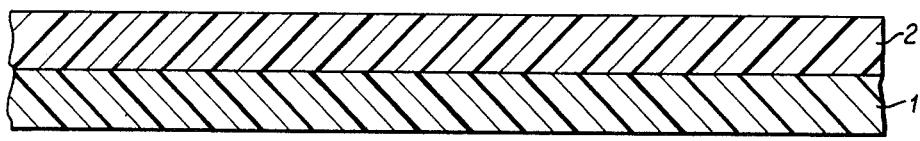
FIGS. 7-11 are sectional views showing a structure according to the invention during the different fabrication steps.

FIG. 7 and following show the steps involved in the fabrication of saturable resistors and transistors which have just been described.

In FIG. 7, the n-type doped active layer 2 having an impurity density of $10^{17}$ at/cm³ and a thickness of 2500 angstroms is formed on the insulating substrate 1 by epitaxial growth.

Figure 8:
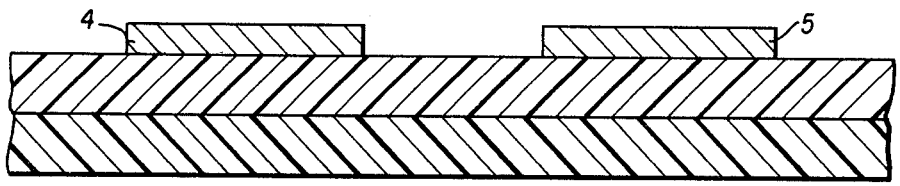

In FIG. 8, any suitable means (such as electronic masking and the like) are employed in order to deposit the two ohmic contacts 4 and 5 (terminals of a resistor, source and drain of a transistor).

Figure 9:
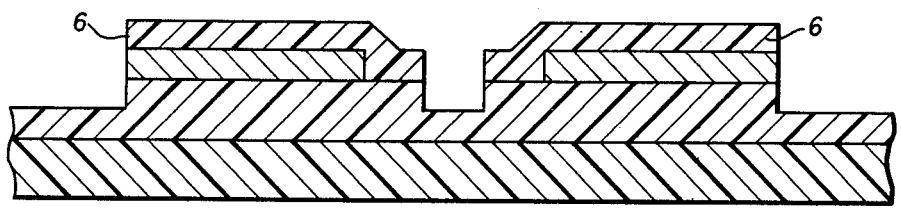

In FIG. 9, a silica mask 6 has been formed in order to define the groove which serves as a channel in order to protect the surface of the transistors or the resistor terminals in the spaced formed between these latter and the channel; this masking operation has made it possible to form the channel 7 by means of a conventional method of chemical etching.

Figure 10:
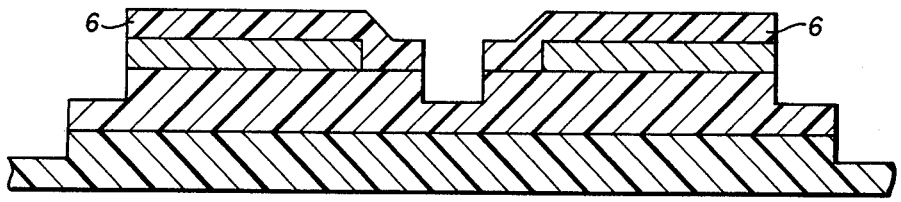

In FIG. 10, a "mesa" etch has been performed at 10 and 11, for example through an aluminum mask which covers the entire surface of the transistors; the residual aluminum was removed after machining by selective chemical attack.

Figure 11:
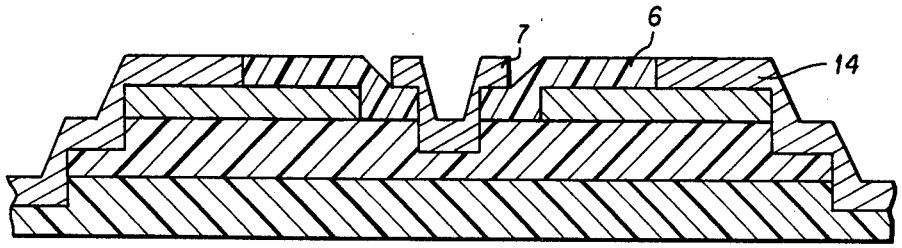

In FIG. 11, machining of the grooves has been performed. The ionic machining process was employed in order to obtain vertical sides. The erosion energy is fairly low (100 KeV to 500 KeV). The depth of the groove can be controlled by measuring the current between the ohmic contacts at constant voltage.

Finally, if it is desired to obtain a field-effect transistor, deposition of a Schottky gate 7 is performed within the groove by successive depositions of titanium, platinum and gold.

The following figures illustrate logic circuits which make use of structures according to the invention.

The advantage of some types of field-effect inverters comprising enhancement-mode transistors lies in the fact that, since the transistors are normally "off", they are turned-on only by applying to the gate voltages having the same polarity as the supply voltage.

Such inverters are nevertheless attended by a disadvantage in that they are difficulat to construct since the parameters of the active layer have to be controlled with extremely high precision. Furthermore, the use of source and gate transistors interconnected as saturable resistors is incompatible with this type of transistor.

In the case of the invention, the saturable resistors and the groove-type channel enhancement transistors can be fabricated simultaneously. In addition, the threshold voltage $V_T$ of the field-effect transistors can be controlled during fabrication as has been noted earlier.

Figure 12:
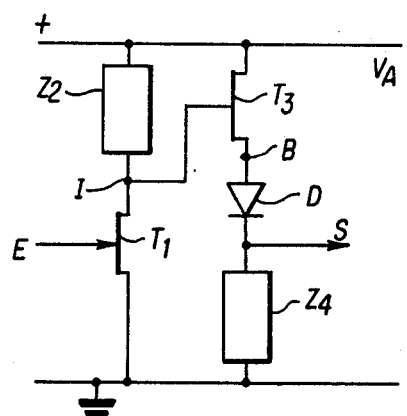
FIG. 12 is a circuit diagram of one example of a logic circuit which makes use of the structures according to the invention.

There is shown in FIG. 12 a logic inverter in which the logic input E is connected to the gate of a transistor $T_1$, the source of which is connected to ground, the drain of which is connected to a node I, said node being in turn connected to the supply source $V_A$ through a saturable resistor $Z_2$.

The transistor $T_1$ is preferably of the type shown in either FIG. 3 or FIG. 4, and the saturable resistor is of the type shown in FIGS. 1 and 2.

The node I is connected to the gate of a transistor $T_3$ is connected to the supply line $V_A$ whilst its source B has a diode D which conducts from $V_A$ to ground, the other terminal of said diode D being connected to ground through a resistor $Z_4$ of the same type as the resistor $Z_2$.

By way of example, the channel width Z (or length of the groove) is 40 μm in the case of the structures of $T_1$, $T_3$ and $Z_4$ and 20 μm in the structure of $Z_2$. In general terms, the width of the structure of $Z_2$ must be smaller than that of the transistor $T_1$. Moreover, an optimum logic circuit is obtained when the structures of $T_1$, $T_3$ and $Z_4$ have the same channel width.

The operation of the structure according to the invention will become apparent from the following figures.

In the first place, emphasis should be laid on the fact that an important parameter of the field-effect transistors herein described is that of the residual voltage $V_{residual}$ which is the residual drain-source voltage when the transistor is in the conducting state.

In circuits of known type, the input transistor of a logic circuit can be cut-off only if $V_T \geq V_{residual}$.

These circuits can therefore be constructed in practice only with distinctly positive thresholds of the order of 0.2 V, namely between 150 and 200 mV. In the circuits which will be described hereinafter, this condition no longer exists.

Figure 13:
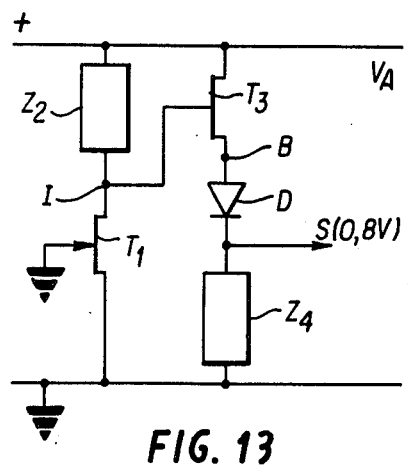
FIGS. 13 and 14 are circuit diagrams of the circuit of FIG. 12 in two logical states.

In FIG. 13, the input E is connected to ground in the state "0", the transistor $T_1$ is cut-off, the potential at the node I is in the vicinity of $V_A$, the gate-source junction of the transistor $T_3$ is forward-biased, the potential at the node B (source of the transistor $T_3$) tends to rise to $V_A$. The potential at the output S cannot rise above 0.8 V since it is connected to the input gate of the following stage (which is identical with that of FIG. 13) and since the voltage drop at the terminals of the gate-source junction of the transistor $T_1$ (which is in the conducting state in this case) is of the order of 0.8 V.

The voltage $V\delta$ across the terminals of the diode D which is in the conducting state is also of the order of 0.8 V. The output current is limited by the resistor $Z_2$.

Figure 14:
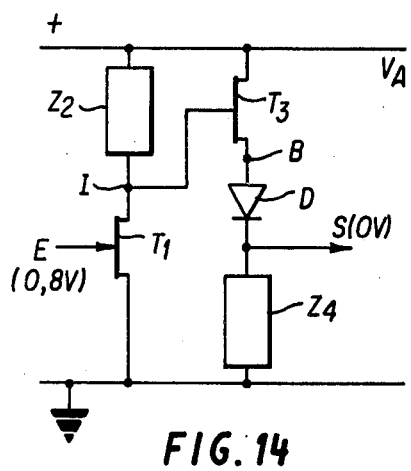

In FIG. 14, the gate of the transistor $T_1$ is brought to level "1" (substantially 0.8 V) which is limited by the forward bias of the gate-source junction.

By definition, the potential at the node I is the $V_{residual}$ voltage of the transistor $T_1$ which is in the conducting state.

This tends to turn-off the transistor $T_3$; the current throughout the assembly $T_3-D-Z_4$ will remain of very low value.

The output S is bridge-connected between the diode D and the resistor $Z_4$. In point of fact, the resistor $Z_4$ has a very low value and the resistance of the diode in respect of a very low potential in the forward direction applied between its terminals is distinctly higher. The diode consequently handles the entire residual potential between B and ground; the output S is therefore clamped to ground.

By reason of the highly non-linear characteristic of the diode in the vicinity of its knee voltage, only a very low current is required within the assembly $T_3-D-Z_4$ for this effect to take place.

The result thereby achieved is that, in the inverter under consideration, the condition $V_T$ which is very close to 0 but essentially positive is no longer necessary and that it will prove sufficient to maintain the inequality $V_T \geq V_{residual} - V\delta_o$, where $V\delta_o$ is the value of knee voltage of the diode D. $V_T$ could even be negative since the knee voltage of the diode is in the vicinity of 0.5 V. $V_T$ could be higher than $-0.3$ V rather than $V_{residual}$.

In the case of several diodes in series (two diodes, for example), the results achieved would be such that $V_T > 0.8$ V.

To sum up, although the diode D is always forward-biased, it is essentially the presence of said diode which makes it possible to increase the range of threshold voltages towards low and even negative values and which clamps the output at the bottom level; the residual voltage of the transistors is no longer a determining factor.

Figure 15:
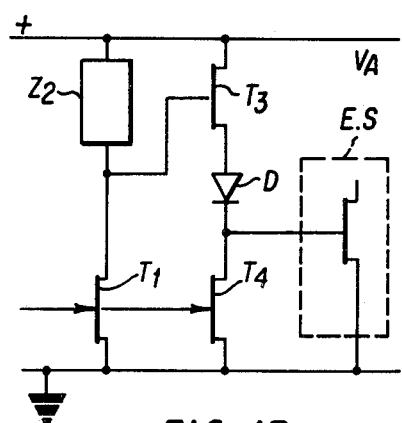
FIGS. 15 and 16 respectively are circuit diagrams showing two other circuits.

There is shown in FIG. 15 an alternative embodiment of the logic circuit of FIG. 12 in which a transistor $T_4$ has been substituted for the resistor $Z_4$ and in which the transistor gate is connected in parallel with the gate of transistor $T_1$ whilst the remainder of the circuit remains unchanged. This circuit arrangement has the following advantages:

When the transistor $T_4$ is turned-off (state "0" at the input), the current within the transistor is lower than in the resistor $Z_4$ of the previous figures. In this state, however, the potential drop takes place essentially within the diode D.

By way of example, the performances measured on a ring oscillator constituted by eleven inverters of the type shown in FIG. 15 are as follows:

| | | |
|---|---|---|
| $V_A = 1.4$ V | $t_{pd} = 300$ ps | $p = 360$ μW |
| $V_A = 2.4$ V | $t_{pd} = 110$ ps | $p = 2$ mW |
| $V_A = 3.4$ V | $t_{pd} = 95$ ps | $p = 4.5$ mW | in respect of:

$$N = 1.5 \times 10^{77} \text{ cm}^{-3}; L = 1 \text{ μm}; X_{SD} = 3 \text{ μm}$$

where N is the doping of the active zone, L is the channel length (FIG. 2), $X_{SD}$ is the source-drain distance of each component.

Furthermore, we have:

$$Z(T_1) = Z(Z_2) = Z(T_4) = 35 \text{ μm}$$
$$Z(T_3) = Z(D) = 40 \text{ μm}$$

where Z is the width of each element (shown between brackets).

Figure 16:
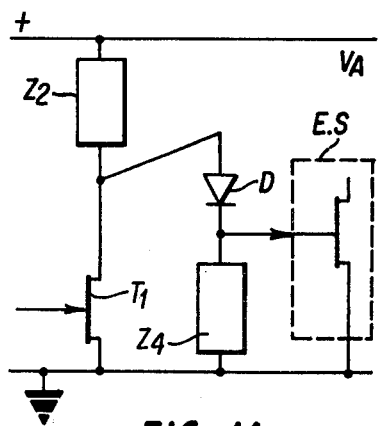

Another alternative embodiment is shown in FIG. 16. Compared with the circuit arrangement of FIG. 12, the transistor $T_3$ has been dispensed with, thus resulting in higher integration density. The condition to be satisfied in regard to the different currents is as follows:

$$I(Z_2) > I_{DSS}(T_1) + I(Z_4)$$
$$I(Z_2) < I_{max}(T_1) + I(Z_4)$$

where $I_{DSS}(T_1)$ is the saturation current of $T_1$ at $V_{GS}=0$ (zero in the case of an enhancement-mode MESFET) and $I_{max}(T_1)$ is the maximum current of transistor $T_1$ in the case of the input in the high state, and $I(Z_1)$ is the current within resistor $Z_4$.

This circuit arrangement has the disadvantage of power consumption in both states.

From the above discussion, it is seen that it is indeed feasible to fabricate a composite of structure with a groove in the channel obtained by ion machining of all the f.e.t. structures, these structures giving either saturable resistors or normally-off transistors. This, the logic circuit shown in FIGS. 12-14 have been manufactured with both transistors and resistors of each stage including a grooved channel. This has been thought desirable from an industrial point of view, since it would not otherwise be possible to control with enough accuracy the thickness "$a_1$" shown in FIG. 17 of the n-type active layer of the gallium arsenide wafers destined to accomodate hundreds or thousands of logic circuits. As a matter of fact, when forming by epitaxy the active layer, an undesirable and often unavoidable bevelling or sloping has been observed, in other words the thickness "$a_1$" has not been constant. Therefore, it has been necessary to manufacture an active layer much thicker than necessary and to control the channel thickness of each saturable resistor by cutting a groove in the layer at the location of the resistor. From a industrial point of view, therefore, the inventors have developed another advantageous approach for the manufacturing circuits shown in FIGS. 12-14 as follows:

field effect transistor manufactured by ion etching of a groove in the channel;

a conventional saturable resistor made of normally-on f.e.t. whose gate is directly connected to source.

Figure 17:
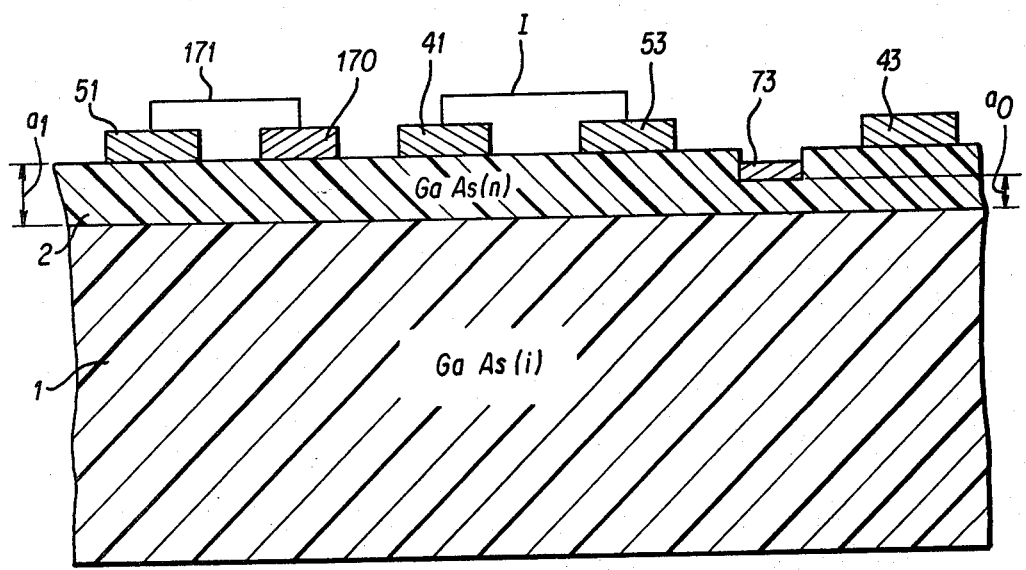
FIG. 17 is a sectional view illustrative of a method of manufacturing the circuits shown in FIGS. 12-14.

Referring to FIG. 17, the new method manufacturing the circuits shown in FIGS. 12-14 is carried out in the following manner:

Step 1: Starting from a semi-insulating gallium arsenide wafer 1 forming an n-type active layer (2) onto a large face of the wafer (1) using any conventional method (epitaxy, ion implantation etc.), the thickness of the layer being at least a predetermined value "$a_1$".

Step 2: Alternately controlling the layer thickness and etching the layer surface as follows:

(i) controlling the thickness "$a_1$" using a conventional apparatus called a "C.V. profiler" or "profile controller" measuring the doping concentration as a function of the depth in the layer, by measuring the capacitance in proportion as a growing d.c. voltage makes to grow the depth of a depleted region in the active layer (2);

(ii) for etching the surface, using a conventional method such as anodic oxidation, ion milling or plasma etching.

Figure 18:
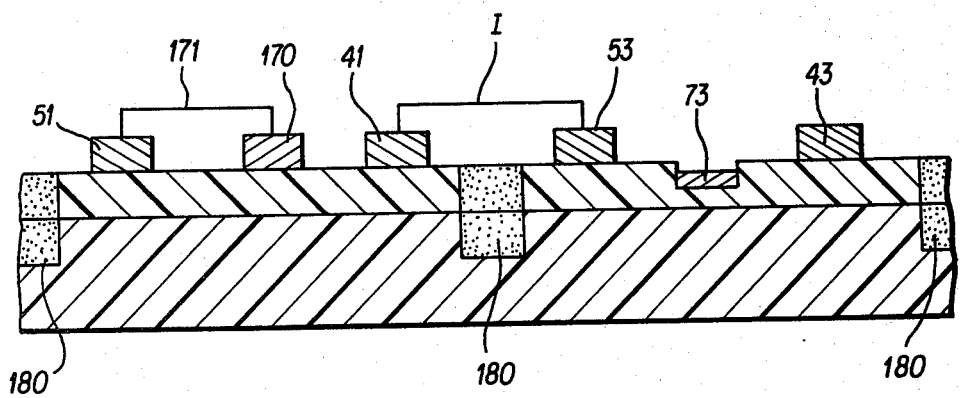
FIG. 18 is a sectional view showing a structure according to the invention at a particular fabrication step.

Step 3: Insulating from one another the "stages" of the plurality of logic circuits created onto the wafer, each "stage" consisting of two components, e.g., a field-effect transistor in series with a saturable resistor (see FIG. 12, first and second stage) or two transistors (see FIG. 15, second stage) or a diode in series with a saturable resistor (see FIG. 16, second stage). The insulation is carried out by a conventional method such as a mesa etching or an ionic implantation of protons, boron ions or oxygen ions in regions 180 shown in FIG. 18.

Step 4: Depositing simultaneously ohmic contacts of the plurality of resistors and transistors (see FIG. 17, contacts 41, 51 for a resistor and 43, 53 for a transistor).

Step 5: Depositing simultaneously Schottky contacts of all resistors (see 170, FIG. 17).

Step 6: Depositing metallic connections (171) between sources (51) and gate (170), then measuring the drain-source current and deducing from the latter the accurate thickness "$a_1$" at the location of each logic circuit.

Step 7: Cutting the groove of each transistor at a depth determined to obtain a channel depth "$a_0$" deduced from the reckoning of the accurate thickness "$a_1$" deduced of the measurements of Step 6.

Step 8: Depositing the Schottky contacts (73, FIG. 17) of the transistors in the grooves cut at Step 7.

Step 9: Finishing the logic circuit in a conventional manner by depositing metallizations according to a connecting network including the terminals of the circuit, and protecting the logic circuit by depositing one or more layers of passivating materials.

Optionally dielectric deposits are formed at the location of future crossing of connections:

(i) between Steps 6 and 7;
(ii) between Steps 8 and 9.

An additional advantage of the abovedescribed process resides in the possibility of forming simultaneously logic circuits and their output amplifiers on the same wafer without any masking step and groove machining, because the thickness "$a_1$" of the active layer has been controlled with enough accuracy.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of manufacturing a logic circuit having at least one field effect transistor and at least one saturable resistor, comprising:

forming an active semiconductor layer on a face of a semi-insulating substrate, said active layer formed with a thickness of at least a predetermined value $a_1$;

depositing simultaneously ohmic contacts to produce source and drain regions for said at least one saturable resistor and said at least one field effect transistor;

depositing a Schottky contact between the source and drain ohmic contacts of said at least one saturable resistor to form a gate region;

depositing a metal connection between the source contact and the Schottky contact of said at least one saturable resistor;

applying a voltage to the source and drain contact of said at least one saturable resistor and then measuring the drain-source current therein to deduce therefrom a measure of the localized thickness of $a_1$ at the location of the logic circuit including the at least one saturable resistor and the at least one field effect transistor;

cutting a groove between the source and drain contacts of the at least one field effect transistor to obtain a predetermined channel depth $a_0$ from the bottom of said groove to said semi-insulating substrate, the depth of said groove ($a_1-a_0$) being determined by the localized measurement of $a_1$ from the preceding step; and depositing a Schottky contact in the groove of said at least one field effect transistor.

2. A method according to claim 1, wherein said form step comprises:

controlling the thickness $a_1$ of said active semiconductor layer by measuring the doping concentration thereof as a function of the depth in said active layer.

3. A method according to claim 2, wherein said controlling step comprises:

measuring the capacitance of said active semiconductor layer in relation to the growth of the depth of a depleted region in said active layer in dependence upon application of a growing d.c. voltage thereto.

4. A method according to claim 1, for manufacturing a logic circuit having plural stages, each stage comprising at least one of said field effect transistors connected in series with at least one of said saturable resistors, comprising:

insulating each of said stages after said forming step.

5. A method according to claim 1, further comprising:

forming dielectric deposits at the location of predetermined connection crossings of said logic circuit after deducing the localized thickness $a_1$ prior to cutting said groove.

6. A method according to claim 1, further comprising:

forming dielectric deposits at the location of predetermined connection crossings of said logic circuit after depositing said Schottky contact in the cut groove.

* * * * *